United States Patent [19]

Sommer et al.

[11] 4,220,962
[45] Sep. 2, 1980

[54] SURFACE PASSIVATED SEMICONDUCTOR DEVICE AND METHOD FOR PRODUCING THE SAME

[75] Inventors: Karlheinz Sommer; Werner Köhler, both of Warstein, Fed. Rep. of Germany

[73] Assignee: Licentia Patent-Verwaltungs-G.m.b.H., Frankfurt am Main, Fed. Rep. of Germany

[21] Appl. No.: 915,355

[22] Filed: Jun. 14, 1978

[30] Foreign Application Priority Data

Jun. 14, 1977 [DE] Fed. Rep. of Germany ....... 2726667

[51] Int. Cl.$^2$ .................... H01L 29/34; B05D 5/12; B05D 3/02
[52] U.S. Cl. ........................... 357/52; 427/82; 427/195; 357/72
[58] Field of Search .................. 357/72, 52; 427/82, 427/195

[56] References Cited

U.S. PATENT DOCUMENTS

| 3,310,431 | 3/1967 | Loose | 427/195 |
| 3,684,592 | 8/1972 | Chang | 357/52 |
| 3,920,793 | 11/1975 | Teti | 427/195 |
| 3,936,569 | 2/1976 | Miller | 427/195 |
| 3,958,039 | 5/1976 | Yabuki | 427/195 |
| 4,013,807 | 3/1977 | Putney | 427/195 |
| 4,017,886 | 4/1977 | Tomono et al. | 357/72 |

FOREIGN PATENT DOCUMENTS

| 570082 | 10/1958 | Belgium . |
| 1137140 | 9/1962 | Fed. Rep. of Germany . |
| 1197548 | 7/1965 | Fed. Rep. of Germany . |
| 1292756 | 4/1969 | Fed. Rep. of Germany . |
| 2322347 | 11/1974 | Fed. Rep. of Germany . |

Primary Examiner—John D. Smith
Assistant Examiner—Richard Bueker
Attorney, Agent, or Firm—Spencer & Kaye

[57] ABSTRACT

Surface passivated semiconductor device including a semiconductor wafer in which a surface portion which intersects a pn-junction is covered with an organic passivation layer. The passivation layer consists of a partially fluorinated hydrocarbon polymer and is formed as a continuously molten coating which is produced by coating the surface portion with a powder which contains predominantly particles of a grain size less than 30μ. A method is provided for producing the device.

11 Claims, 1 Drawing Figure

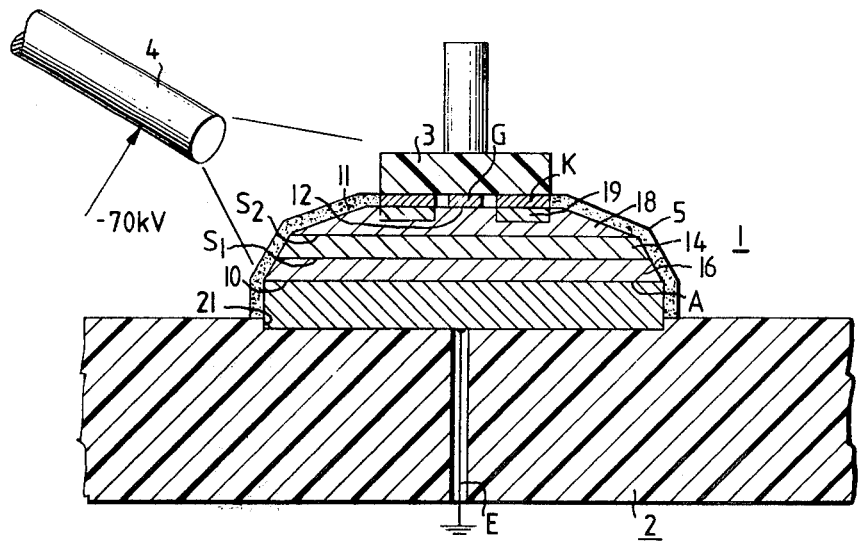

SURFACE PASSIVATED SEMICONDUCTOR DEVICE AND METHOD FOR PRODUCING THE SAME

BACKGROUND OF THE INVENTION

The present invention relates to surface passivated semiconductor devices having a semiconductor wafer in which surface portions which intersect pn-junctions are covered with an organic passsivation layer and to methods for producing a surface passivated semiconductor device, particularly to the production of the surface passivation.

The majority of known surface passivated semiconductor devices have silicon semiconductors in which the semiconductor surface is coated with an inorganic passivation layer to protect the pn-junctions where they come to the surface. Such protective layers, for example, of silicon dioxide ($SiO_2$), are produced by means of known diffusion masking techniques, such as disclosed in Belgian Pat. No. 570,582, in which after completion of the diffusion process, the diffusion mask is left on the semiconductor surface. As disclosed in German Auslegeschrift No. 1,197,548, contaminating of the diffusion mask may occur during the diffusion process, and the German Auslegeschrift describes a process to prevent contaminating.

Passivation layers may also be produced by means of special processes which do not use the passivation layers as diffusion masks, for example, as defined in German Auslegeschrift No. 1,137,140 where a protective coating is made of different types of inorganic and/or organic substances such as silicone rubber, glasses and polyimides. Semiconductor devices of silicon whose surface has been provided with an inorganic passivation layer by the techniques explained above, cannot be operated at high operating voltages in a housing that is not hermetically sealed.

Other surface passivated semiconductor devices of silicon are known, for example, from German Auslegeschrift No. 1,292,756 and German Offenlengungsschrift No. 2,322,347, in which the semiconductor surface is covered with a purely organic passivation layer, for example, of silicone lacquer or polyimide and polyhydantoine, respectively, or of a sequence of organic layers. These protective layers are produced by means of special processes which are relatively complicated. Such protective layers are permeable to water vapor so that the components involved must be encapsulated for use.

SUMMARY OF THE INVENTION

A primary object of the present invention is to provide, for semiconductor devices of the above-mentioned type, a surface passivation by means of a passivation layer which can be produced easily and which shields the surface of the semiconductor against atmospheric influences so that semmiconductor devices can be used without housings or in housings that are not sealed hermetically.

A further object of the present invention is to provide methods for producing such a device.

Additional objects and advantages of the present invention will be set forth in part in the description which follows and in part will be obvious from the description or can be learned by practice of the invention. The objects and advantages are achieved by means of the processes, instrumentalities and combinations particularly pointed out in the appended claims.

To achieve the foregoing objects and in accordance with its purpose, the present invention provides a surface passivated semiconductor device including a semiconductor wafer in which a surface portion which intersects a pn-junction is covered with an organic passivation layer, comprising a passivation layer which consists of a partially fluorinated hydrocarbon polymer and is formed as a continuously molten coating which is produced by coating the surface portion with a powder which contains predominantly particles of a grain size less than $30\mu$.

Preferably, the powder coating is composed of a copolymerizate of tetrafluorethylene and ethylene.

In another aspect of the present invention, a method is provided for producing such a surface passivated semiconductor from a silicon semiconductor device which has been provided with a surface portion which intersects a pn-junction and with electrodes and which has been prepared by grinding and etching its surface, comprising: covering the electrodes with a mask and leaving the surface portion unmasked, heating the semiconductor device to slightly more than 280° C., covering the unmasked surface portion of the heated device with a powder of a partially fluorinated hydrocarbon polymer, the powder predominantly containing particles of a grain size less than $30\mu$, thereafter removing the mask, keeping the coating at 320° C. for 4 to 10 minutes after the removal of the mask, and then cooling the resulting coating to room temperature.

Another method for producing such a surface passivated semiconductor device from an unheated silicon semiconductor device which has been provided with a surface portion which intersects a pn-junction and with electrodes and which has been prepared by grinding and etching its surface, comprises: covering the electrodes with a mask and leaving the surface portion unmasked, electrostatically spraying a coating of a powder of a partially fluorinated hydrocarbon polymer onto the unmasked surface of the etched and unheated device, the powder predominantly containing particles of a grain size of less than $30\mu$, thereafter removing the mask, melting the coating for 4 to 10 minutes at 320° C. after removal of the mask, and then cooling the resulting coating to room temperature.

It is to be understood that both the foregoing general description and the following detailed description are examplary, but are not restricitive of the invention.

BRIEF DESCRIPTION OF THE DRAWINGS

The sole FIGURE of the drawing shows one embodiment of a method for producing a passivation layer on a silicon semiconductor device in accordance with the teachings of the present invention.

DETAILED DESCRIPTION OF THE INVENTION

For use and practice of the manufacturing process, the semiconductor device which generally is in the form of a silicon wafer and which has a zone structure containing at least one pn-junction which intersects a surface of the wafer and which is provided with electrodes, is initially prepared by grinding an edge surface of the wafer, then etching this edge surface, then rinsing the edge surface with deionized water and drying in a furnace.

Referring now to the drawing, there is shown a semiconductor device 1 having two opposing planar parallel major surfaces 10 and 12 and an edge face or peripheral edge 11. Device 1 is provided with a zone structure containing zones of opposite conductivity type. As shown in the drawing, device 1 is provided with four zones of alternatingly opposite conductivity type, comprising a high-ohmic n-type conductivity center zone 14, two p-type conductivity zones 16 and 18 respectively, which are adjacent each side of the zone 14, and an n-type emitter zone 19. A first pn-junction $S_1$ is formed between zones 14 and 16, and a second pn-junction $S_2$ is formed between zones 14 and 18. The first pn-junction $S_1$ and the second pn-junction $S_2$ both intersect edge face 11.

Semiconductor device 1 is provided with a major electrode A which extends over the entire surface of its major surface 10. Semiconductor device 1 is mounted with its major electrode A on a polytetrafluoroethylene (Teflon) block 2 through which a ground lead E passes to contact this major electrode. Other electrodes K and G are arranged in a planar manner in major face 12 of device 1 opposite major or mounting face 10 and are covered with a centered mask 3 which is made of polytetrafluoroethylene (Teflon).

With the aid of a spray pistol 4, kept at $-70$kV, the unmasked edge face 11 of unheated device 1 is now electrostatically sprayed and coated with a powder consisting of a copolymerizate of tetrafluoroethylene and ethylene to form a powder coating 5. This powder coating 5 also covers the Teflon mask 3. On edge face 11, the sprayed material adheres immediately and excellently. After spraying, Teflon mask 3 is removed from major surface 12 and electrodes G and K, and spray material that might have reached these electrodes or electrode A can be removed with the aid of a gas jet, for example, a nitrogen gas jet. The sprayed material on Teflon mask 3, however, can later be removed very easily, for example, by blowing.

Finally, semiconductor device 1 is heated to more than 280° C., approximately to 320° C. The temperature is kept constant at 320° C. for no more than 10 minutes, such as for 4 or 5 to 10 minutes, whereby the already continuous coating 5 melts together and forms a hermetic coating. Thereafter, the entire structure is left to cool to room temperature.

A plurality of semiconductor devices mounted in circular recesses 21 on Teflon block of corresponding size can be passivated simultaneously according to the just described electrostatic spray process. The quantity of the sprayed material and the spray pistol can be dimensioned so that the resulting coating will have a desired thickness between $30\mu$ and $70\mu$.

In another embodiment of a method fo producing semiconductor devices, individual semiconductor devices can be passivated by the following modified process. In this case, a semiconductor device to be passivated, after being masked, is heated in a furnace to 280° C. to 300° C., even before its unmasked surface 11 is coated. The heated wafer is then covered with a powder, such as a copolymerizate of tetrafluoroethylene and ethylene, as by spraying. This organic coating powder melts at temperatures of about 280° C. and forms a continuous, smooth coating. The Teflon mask is not attacked by the melting coating powder. The mask is then removed, and after removal of the mask, the coating is treated for 4 or 5 to 10 minutes at 320° C. and is subsequently cooled to room temperature. It is sufficient to let the melting coating cover that part of edge surface 11 at which pn-junctions come to this edge surface.

The thermal treatment for a duration of 4 or 5 to 10 minutes is sufficient for the molten coating to become continuous. During cooling of the coating to room temperature, the coating solidifies without shrinking and without losing its adhesion to the semiconductor surface.

Coatings of the described partially fluorinated hydrocarbons have the advantageous property that they neither absorb nor transmit water and moisture, and can therefore be used as a stable passivation agent on semiconductor surfaces in housings which do not have a hermetic seal. They are also good insulators and withstand high thermal stresses. The material for the coating powder is available in a technically high purity.

The described processes can also be used to passivate planar semiconductor devices.

Partially fluorinated hydrocarbon polymers are characterized by the fact that only a part of the hydrogen atoms in the hydrocarbon chain have been replaced by fluorine atoms or fluorinted alkyl groups.

Ethylene-tetrafluoroethylene (ETFE) as a copolymer of tetrafluoroethylene and ethylene ($-CH_2-CH_2-CF_2-CF_2-$)$_n$ contains both monomers in equal percentage. Another example of a partially fluorinated hydrocarbon is ethylene-chlorotrifluoroethylene (ECTFE) which is a copolymer of ethylene and chlorotrifluoroethylene ($-CH_2-CH_2-CFCl-CF_2-$)$_n$, consisting of both monomers in equal percentage. ECTFE can also be used for electrostatic coatings.

It will be understood that the above description of the present invention is susceptible to various modifications, changes and adaptations, and the same are intended to be comprehended within the meaning and range of equivalents of the appended claims.

What is claimed is:

1. Surface passivated semiconductor device comprising a semiconductor wafer having a semiconductor surface portion which intersects a pn-junction and an organic passivation layer consisting of a partially fluorinated hydrocarbon polymer which is in contact with and covers said semiconductor surface portion including the intersection of the pn-junction with the semiconductor surface portion, said passivation layer being formed as a continuous coating which is produced by applying directly to the semiconductor surface portion a powder of said polymer which contains predominantly particles of grain size less than $30\mu$, said powder being melted and then solidified to form the continuous coating.

2. Semiconductor device as defined in claim 1 wherein the powder coating is composed of a copolymerizate of tetrafluoroethylene and ethylene.

3. Semiconductor device as defined in claim 1 wherein the passivation layer has a thickness of at least $30\mu$.

4. Semiconductor device as defined in claim 1, which includes at least two pn-junctions which intersect semiconductor surface portions, and the passivation layer covers these semiconductor surface portions.

5. Method for producing a surface passivated semiconductor from a silicon semiconductor device which has been provided with a semiconductor surface portion which intersects a pn-junction and with electrodes and which has been prepared by grinding and etching its semiconductor surface comprising: covering the electrodes with a mask and leaving the semiconductor surface portion unmasked, heating the semiconductor device to slightly more than the melt range of a partially fluorinated hydrocarbon polymer, directly contacting and covering the unmasked semiconductor surface portion of the heated device with a powder of the partially fluorinated hydrocarbon polymer, the powder predominantly containing particles of a grain size less than 30μ, thereafter removing the mask, heating the coating for final cure until a smooth coating is obtained after removing the mask, and then cooling the resulting coating to room temperature.

6. Method as defined in claim 5, wherein the semiconductor device includes at least two pn-junctions which intersect semiconductor surface portions, and the passivation layer covers these semiconductor surface portions.

7. Method as defined in claim 5 wherein the mask is a polytetrafluoroethylene mask.

8. Method as defined in claim 4, wherein the spraying occurs on a grounded semiconductor device.

9. Method for producing a surface passivated semiconductor device from an unheated silicon semiconductor device which has been provided with a semiconductor surface portion which intersects a pn-junction and with electrodes and which has been prepared by grinding and etching its semiconductor surface, comprising: covering the electrodes with a mask and leaving the semiconductor surface portion unmasked, elastrostatically spraying a coating of a powder of a partially fluorinated hydrocarbon polymer, the powder predominantly containing particles of a grain size less than 30μ, onto the unmasked semiconductor surface portion of the etched and unheated device to directly contact the semiconductor surface portion with the powder, then removing the mask, heating the coating for final cure until a smooth coating is obtained after the mask is removed, and then cooling the resulting coating to room temperature.

10. Method as defined in claim 9, wherein the semiconductor device includes at least two pn-junctions which intersect semiconductor surface portions, and the passivation layer cover these semiconductor surface portions.

11. Method as defined in claim 9, wherein the mask is a polytetrafluoroethylene mask.

* * * * *